(12) United States Patent
Lin et al.

(10) Patent No.: US 7,970,597 B2
(45) Date of Patent: Jun. 28, 2011

(54) EVENT-DRIVEN EMULATION SYSTEM

(75) Inventors: Meng-Chyi Lin, Pingjhen (TW);
Fei-Sheng Hsu, Hsinchu (TW);
Sweyyan Shei, Cupertino, CA (US)

(73) Assignee: Springsoft, Inc., Hsinchu (TW)

( * ) Notice: Subject to any disclaimer, the term of this patent is extended or adjusted under 35 U.S.C. 154(b) by 429 days.

(21) Appl. No.: 12/120,895

(22) Filed: May 15, 2008

(65) Prior Publication Data

US 2009/0287468 A1     Nov. 19, 2009

(51) Int. Cl.
*G06F 9/455* (2006.01)
(52) U.S. Cl. ............................................ 703/23; 714/34
(58) Field of Classification Search .................... 703/23; 716/12; 714/34
See application file for complete search history.

(56) References Cited

U.S. PATENT DOCUMENTS

| | | | | |
|---|---|---|---|---|
| 5,282,213 | A * | 1/1994 | Leigh et al. | 714/724 |
| 5,802,348 | A * | 9/1998 | Stewart et al. | 703/25 |
| 6,182,247 | B1 * | 1/2001 | Herrmann et al. | 714/39 |
| 7,065,481 | B2 * | 6/2006 | Schubert et al. | 703/14 |
| 7,072,818 | B1 * | 7/2006 | Beardslee et al. | 703/14 |
| 2004/0254906 | A1 * | 12/2004 | Shei et al. | 706/921 |

OTHER PUBLICATIONS

O'Reilly, Dubugging Drivers with Emulators and Logic Analyzers, Feb. 1998, Embedded Systems Programming, pp. 84-95.*

* cited by examiner

*Primary Examiner* — Kamini S Shah
*Assistant Examiner* — Bernard E Cothran
(74) *Attorney, Agent, or Firm* — Chernoff, Vilhauer, McClung & Stenzel

(57) ABSTRACT

A circuit emulator includes emulation resources programmed to emulate a circuit, a clocking system for clocking logic implemented by the emulation resources, a resource interface circuit, a logic analyzer, and a debugger. The resource interface circuit supplies input signals to the emulation resources, stores data representing behavior of signals generated by the emulation resources produces in response to the input signals and configures operating characteristics of the clocking system. Upon detecting a specified event in the selected signals of the emulation resources, the logic analyzer asserts a trigger signal telling the clocking system to stop clocking the emulation resources. Communicating with the resource interface circuit and the logic analyzer via a packet routing network, the debugger acquires and processes the data stored by the resource interface circuit and transmits commands to the resource interface circuit and the logic analyzer specifying clocking system operating characteristics, controlling signal data transfer to the debugger, and defining the signal events the logic analyzer is to detect.

19 Claims, 3 Drawing Sheets

EVENT-DRIVEN EMULATION SYSTEM

BACKGROUND OF THE INVENTION

1. Field of the Invention

The invention relates in general to circuit emulators and in particular to a debugger-controlled circuit emulator controlled by a debugger that can interrupt an emulation in response to events occurring in emulator signals detected by a logic analyzer.

2. Description of Related Art

Integrated circuit (IC) designers frequently employ circuit simulators and emulators to verify that ICs fabricated in accordance with their designs will behave as expected.

A computer-based circuit simulator calculates how signals produced by the IC would respond to particular input signals patterns based on mathematical models of transistors and other devices included in the IC and produces a "dump file" containing waveform data sequences presenting the behavior of its input, output and internal signals. When a simulator bases its calculations on accurate device modules, its output data can provide highly accurate and detailed information about the behavior of every signal of the simulated IC. Although a simulator can be used to verify both the IC logic and timing, circuit simulation can be time-consuming; a simulator may need several hours or more to simulate a few seconds of IC behavior.

A circuit emulator includes a set of hardware devices such as programmable gate arrays, memories and other emulation resources that are interconnected and programmed to emulate the behavior of an IC described by a netlist or other form of circuit description. Since an emulator transmits and receives real signals, it is sometimes used as an "in-circuit emulator", acting as a substitute for the IC being emulated in the context in which the IC is to be used. For example, if an IC is to be installed in a socket of a circuit board, an emulator emulating the behavior of that IC connected to that socket can communicate with other circuits on the circuit board via signals in the same way the IC would. While an emulator usually cannot operate at clock frequencies as high as the IC it emulates, emulations are usually faster than simulations when carried out at comparable levels of an IC design.

A "co-simulator" includes both an emulator and a simulator for concurrently emulating and simulating separate portions of an IC and for transmitting and receiving data to and from one another representing states of the input/output signals of those separate IC portions. A co-simulator is useful for modeling behavior of a large IC including some portions of proven design whose behavior need not be verified in detailed and other portions that are newly designed and require detailed verification. For example when an IC design to be verified includes an embedded computer of proven design along with some custom designed circuits, the simulator can simulate the embedded computer at a relatively high level while the emulator can emulate the custom circuits.

An emulator includes a data acquisition system for monitoring various emulator signals during emulation and storing data representing behavior of emulator signals during an emulation, including input, output and internal signals of emulator resources. A circuit designer can use a computer-based "debugger" to produce waveform and other displays based on that data that the designer can analyze to determine whether the emulated IC behaved as expected and to help the designer to track down design errors that lead to unexpected signal behavior. Since the high-speed memory that the data acquisition system of an emulator uses to store the data during emulation has a limited storage capacity, a user can program the emulator to monitor only a limited set of emulator signals of interest during the emulation and to store data representing only that limited set of monitored signals. One drawback to this is that if upon using a debugger to review the data collected during an emulation, a user decides he or she would like to review the behavior of any unmonitored signals, it is necessary to reprogram the emulator to monitor those signals and then repeat the emulation in order to collect data representing those signals. Having to repeat an emulation several times in order to collect enough data to track down error sources can greatly increase debugging time.

One way to increase the amount of data an emulator can collect during an emulation without increasing the amount of data acquisition memory needed to store the data is halt the emulation when the memory is full, transfer the data stored in its memory to a hard disk, and then resume the emulation. The drawback to this approach is that frequently interrupting the emulation to flush the data acquisition memory can substantially increase the time required to carry out emulation.

The data currently stored in the internal data storage devices of the emulator such as flip-flops, registers, latches, random accesses memories and the like at any moment during an emulation constitute the current state of an emulated IC at that moment. Some emulators periodically store state data representing "snapshots" of the current emulated IC state during emulation so that if the designer wants to restart an emulation at a some point at which the emulator collected state data, he or she can command the emulator to reload the state data into the emulators storage devices, thereby restoring the emulation to its state at that point. The designer can then restart the emulation at that point. This capability helps to reduce debugging time by making it unnecessary to repeat an entire emulation in order to obtain data representing signal behavior during only a portion of the emulation. Although the snapshot system allows the designer to restart an emulation at a selected point, it does require an emulator to periodically halt an emulation so that it can transfer state data to a hard disk, since an emulator normally does not have the high speed memory resources needed to store all of the state data collected during emulation.

Although a debugger processes the data representing emulator signals, an emulator and a debugger are separate devices. A designer controls an emulator mainly by programming it, but controls a debugger interactively through its display. When a designer using a debugger discovers an error occurred in one the signals it represents and wants to makes some changes to the emulation, for example so that it collects data representing different emulator signals, the designer must reprogram the emulator. The process of iteratively using a debugger to investigate emulation results and then reprogramming the debugger based on that investigation can be time-consuming. What is needed is a system that more closely links a debugger and an emulator so that a user can use a debugger not only to review the results of an emulation but to interactively control and modify the emulation process.

SUMMARY OF THE INVENTION

The invention relates to a circuit verification system including a logic analyzer, a computer-based debugger and one or more resource boards interconnected by a packet routing network. Each resource board includes emulation resources programmed to emulate a portion of a circuit by generating output and internal signals in response to its input signals, a clocking system for generating clock signals for clocking the logic implemented by the emulation resources on that board, and a resource interface circuit for supplying input signals to the emulation resources and for monitoring selected ones of the input, internal and output signals of the emulator resources, and for storing data representing monitored signal behavior.

The clocking systems on all resource boards communicate with one another and with the logic analyzer via a set of trigger signals. Any of the clocking systems or the logic analyzer can be configured to assert or de-assert trigger signals on occurrence of specified events in the signals it monitors. For example, the logic analyzer can assert a trigger signal when a specified event occurs in selected emulation resource input, output and/or internal signals, or the clocking systems can be configured to assert trigger signals after generating a specified number of clock signal edges. Each clocking system clocks its local emulation resources only when all of the trigger signals are de-asserted. When any trigger signal is asserted, all clocking systems stop clocking their local emulation resources, thereby halting circuit emulation.

The resource interface circuit on each resource board communicates with the debugger via packets transmitted over the packet routing network. When the clocking systems halt the emulation in response to a trigger signal assertion, a resource interface circuit can transmit stored data representing the signals it monitors to the debugger via the packet routing network so that the debugger can produce waveform displays and carry out other debugging activities based on that data.

While an emulation is halted, the debugger can respond to user input by sending commands to the emulation interface circuits and to the logic analyzer, for example, to set the phase and frequency of each clock signal produced by the clocking system of each resource board, to specify events that are to trigger future emulation halts, to reset the emulation to a previous state, to save data representing a current emulation state, to select ones of the emulation resource input, output and internal signals that are to be monitored when emulation resumes or to restart the emulation.

Thus an emulation system in accordance with the invention closely links a debugger, an emulator and a logic analyzer so that a user can employ the debugger not only to review the results of emulation but also to interactively control the emulation process, including setting the logic analyzer to halt the emulation when specified signal events occur during an emulation so that the debugger can acquire stored data representing emulation signals and display emulation results when those events occur.

Those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

Figure 1:
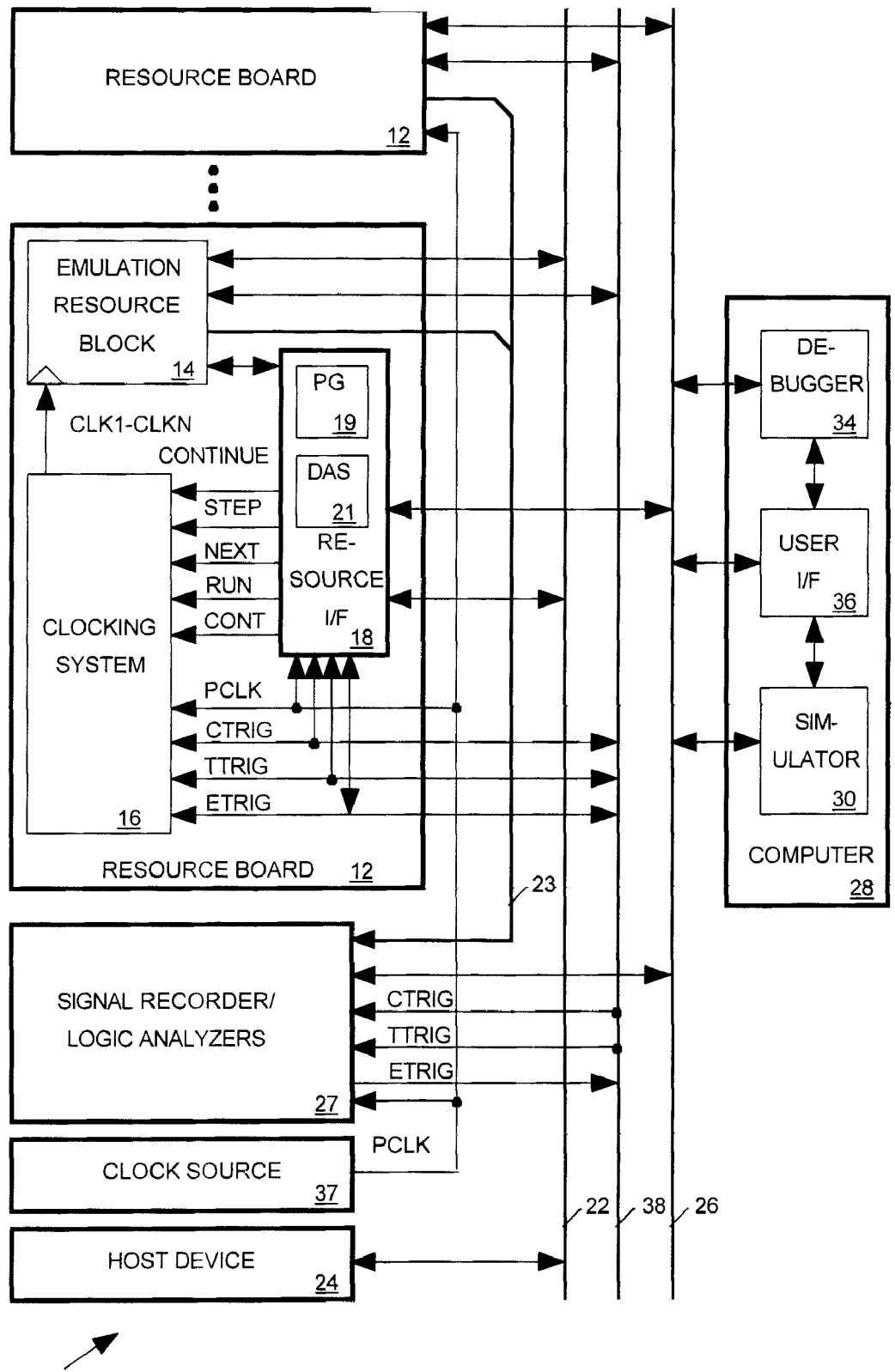
FIG. 1 depicts an emulation system in accordance with the invention in block diagram form.

FIG. 1 depicts a circuit verification system 10 in accordance with the invention including one or more resource boards 12, each containing a block of emulation resources 14 including programmable logic devices, memory and other resources that can be programmably configured and interconnected to emulate behavior of a portion of an integrated circuit (IC). The programmable logic devices may include, for example, programmable gate arrays interconnected for communicating with one another via signals. Each resource board 12 may also include a resource interface circuit 18 having an internal pattern generator (PG) 19 for providing test signal inputs to the local emulation resources 14 residing on the resource board and having an internal data acquisition system (DAS) 21 for monitoring selected input, internal and output signals of the emulation resources 14 and for storing data representing states of monitored signals during emulation.

The emulation resources 14 of separate resource boards 12 can receive input signals from and transmit output signals to one another through a set of conductors 22. When system 10 is used as an in-circuit emulator, resource boards 12 emulate an IC installed in a host device 24 such as a printed circuit board, with conductors 22 also providing signal paths between emulation resources 14 and host device 24 for conveying selected emulation resource input signals from host device 24 and for conveying selected emulation resource output signals to the host device 24. System 10 also includes one or more signal recorder/logic analyzers (SRLAs) 27 for storing data representing behavior of selected ones of the input, internal and output signals of emulation resources 14. Separate sets of conductors 23 convey selected ones of the input, output and internal signals of the emulation resources 14 on each resource board 12 to SRLAs 27 during emulation. Each logic analyzer 27 can be configured to monitor one of more of those signals to determine when specified events occur in those signals.

A computer 28 communicates with the resource interface 18 of each resource board 12 and with SRLA 27 via data packets transmitted through a network 26 such as, for example, an Ethernet network. User interface 36 software running on computer 28 transmits packets containing user-supplied programming and configuration data to resource interface circuits 18 and to SRLA 27. Resource interface circuits 18 can respond to the programming and configuration data by configuring their local emulation resources 14 to emulate portions of an IC and by writing data to various memory devices within emulation resources 14 such as latches, registers and random access memories, and the like, thereby to set an initial state of the emulated circuit before emulation begins. Other user-supplied programming data transmitted via packets to resource interface circuits 18 can configure their internal pattern to generate and supply input signals to emulation resources 14 having specified patterns during emulation and can configure their internal data acquisition systems to acquire data representing selected ones of the input, output, and/or internal signals of the emulation resources during emulation.

When there are not enough conductors 22 to convey all necessary emulation resource input and output signals directly between emulation resources 14 residing on different resource boards 12, resource interface circuits 18 can use network 26 as a "virtual signal path" between emulation resources 14 on different resource boards 12. Each resource interface circuit 18 monitors its local emulation resources 14 to determine states of output signals of the portion of the IC they emulate and transmits packets via network 26 containing data indicating those output signals states. Other resource interface circuits 18 use the data they receive via those packets to control the states of input signals they transmit to their local emulation resources 14 when emulating other portions of the IC.

When system 10 operates as a "co-simulation" system, software running on a computer 28 implements a simulator 30 programmed to simulate a portion of an IC while emulation resources 14 in resource boards 12 emulate other portions of the IC. Emulation resources 14 communicate with simulator 30 though the virtual signal path provided by network 26 and resource interface circuits 18 to send each other data representing states of their output signals. The maximum frequency at which clocking system 16 can clock emulation resources 14 when network 26 acts as a virtual signal path can be limited by the bandwidth provided by network 26, since it is necessary to transmit signal data packets via network 26 during each clock cycle.

Since the number of conductors 23 available for delivering selected input, output and internal signals to SRLAs 27 is limited, the SRLAs can only acquire data representing a limited number signals, however the data acquisition circuits 21 within each resource interface 1 8 can store data representing states of other input, output and internal signals of emulation resources. That data, as well as any data collected by SRLAs 27 is accessible to a debugger 34 implemented by software running on computer 28. Debugger 34 can process the data, for example, to produce waveform displays representing behavior of the emulation resource 14 input, output and internal signals and other displays. As discussed below, debugger 34 can also actively control various aspects of the emulation process in response to user input by sending commands via network 26 to the resource interface circuits 18 and to SRLA 27 before emulation begins or while emulation is halted.

The clocking system 16 on each resource board 12 uses primary clocking signal PCLK as a timing reference for producing a set of N clock signals CLK1-CLKN of programmable phase and frequency for clocking emulation resources 14 and the pattern generator 19 and data acquisition system 21 within resource interface circuit 18 during emulation. Emulation resources 14 can be configured to route one or more of clock signals CLK1-CLKN to host device 24 and SRLA 27 via conductor 22 during in-circuit emulation. SRLA 27 and the clocking systems 16 within the resource boards 12 communicate with one another through trigger signals transmitted via a trigger bus 38. When SRLA 27 or any of clocking systems 16 asserts a trigger signal, all clocking systems 16 halt their output clocks CLK1-CLKN and SLRA 27 stops monitoring signals on lines 22 and 23. After receiving a STEP, NEXT, CONTINUE, or RUN signal from resource interface circuit 18 in response to a command from debugger 34, each clocking system 16 and SRLA de-assert their output trigger signals. All clocking systems 16 then restart the emulation by resuming their output clock signals CLK1-CLKN, and SRLA 27 resumes monitoring the signals on lines 22 and 23. In response to commands arriving in packets via network 26, resource interface circuit 18 provides control data (CONT) for separately controlling the phase and frequency of each of the CLK1-CLKNs signal and triggering activities of clocking system 16.

Debugger Commands

A user can interactively control emulation through debugger 34, which responds to user input by sending any of the following commands in packets via network 26 to resource interface circuits 18 and SRLA 27. Debugger 34 can generate the commands listed below.

Run (M,CLKx)

Debugger 34 sends a Run command to all resource interface circuits 18 and to SRLA 27 to start an emulation. Each resource interface circuit 18 responds to a RUN command by sending a RUN signal to the local clocking system 16 causing it to reset to an initial state and then de-assert the output trigger signals (CTRIG and TTRIG) on trigger bus 38. SRLA 27 also de-asserts its output trigger signal (ETRIG). When all trigger signals (CTRIG, TTRIG, ETRIG) are de-asserted, every clocking system 16 enables its output clock signals CLK1-CLKN for the next M cycles of a selected one of the CLK1-CLKN signals, identified by the CLKx argument of the RUN command, so that emulation resources 14 begin emulating an IC. The number M of cycles of the user-selected CLKX signal is also an argument of the Run command and resource interface circuit 18 supplies control data CONT to clocking system 16 indicating the value of M. SRLA 27 also begins monitoring signals on conductors 22 and 23 when all trigger signals are de-asserted. Following the $M^{th}$ cycle of the CLKx signal, each clocking system 16 halts its output clock signals CLK1-CLKN and asserts its open collector cycle count trigger signal (CTRIG) on bus 38, thereby halting the emulation and telling SRLA 27 to stop monitoring signals on conductors 22 and 23.

Continue (M, CLKx)

Debugger 34 sends a Continue command to all resource interface circuits 18 and to SRLA 27 to resume an emulation that was previously halted by a trigger signal on trigger bus 38. Each resource interface circuit 18 responds to a Continue command by sending a CONTINUE signal to the local clocking system 16 causing it to de-assert the output trigger signals (CTRIG and TTRIG) on trigger bus 38. SRLA 27 also de-asserts its output trigger signal (ETRIG). When all trigger signals (CTRIG, TTRIG, ETRIG) are de-asserted, every clocking system 16 enables its output clock signals CLK1-CLKN for the next M cycles of the selected CLKx signal so that emulation resources 14 resume emulation. The number M and the selected CLKx signal variable are arguments of the CONTINUE command. SRLA 27 also begins monitoring signals on conductors 22 and 23 when all trigger signals are de-asserted. Following the $M^{th}$ cycle of the selected clock signal CLKx, each clocking system 16 halts its output clock signals CLK1-CLKN and asserts its output cycle count trigger signal (CTRIG) on bus 38, thereby halting the emulation and telling SRLA 27 to stop monitoring signals on conductors 22 and 23. The Continue command differs from the Run command in that, unlike the RUN signal asserted in response to a Run command, the CONTINUE signal asserted in response to a Continue command does not tell the clocking system 16 to reset to an initial state in which all clock signals CLK1-CLKN have predetermined starting phase relationships. The CONTINUE signal instead tells clocking system 16 to resume generating CLK1-CLKN signals with the phase relationships they had when last halted. Note that the Run command initializes emulation resources 14 and 16 while the Continue command does not.

Next (M, CLKx, Signals)

Debugger 34 can send a Next command telling each resource interface circuits circuit 18 to send a NEXT signal to the local clocking systems 16. The NEXT signal is generally similar in effect to the CONTINUE signal except that debugger 34 will receive all values of pre-defined signals from resource interface circuit 18 via network 26 upon each clock edge of a next M edges of the selected CLKx signal. Those pre-defined signals can be any emulator signals, defined by arguments of command Next. Thus the run speed of the emulation following a NEXT command will be much slower than following a Continue command in order to allow resource interface circuit 18 sufficient time between CLKx edges to sent signal data to debugger 34. The Continue command is used to resume high-speed execution, but will not allow debugger 34 time to monitor emulation signals. Thus the only signal data that can be collected following a Continue command is data collected and stored locally by resource interface circuits 18 and data stored by SRLAs 27.

Step (M. CLKx)

The debugger 34 can send a Step command to resource interface circuits 18 telling each to configure local clocking to resume an emulation only until it generates a total of M edges of one of the CLK1-CLKN signals selected by the CLKx argument of the Step command. The Step command is similar to the Next command except that debugger 34 will receive values of all pre-selected emulation signals from resource interface 18 via packets conveyed on network 26 following each clock edge of each one of the CLK1-CLKN signals instead of only after each edge of the selected CLKx signal. Thus emulation speed following a Step command is even slower than following a Next command, but the Step command allows debugger 34 to collect more detailed information about time-dependant signal behavior.

The Debugger 34 can send a Step command to resource interface circuits 18 telling each to configure local clocking to resume an emulation only until it generates a total of M edges of one of the CLK1-CLKN signals selected by the CLKx argument of the Step command. The Step command is similar to the Next command except that debugger 34 will receive values of all pre-selected emulation signals from resource interface 18 via packets conveyed on network 26 following each clock edge of each one of the CLK1-CLKN signals instead of only after each edge of the selected CLKx signal. Thus emulation speed following a Step command is even slower than following a Next command, but the Step command also debugger 34 to collect more detailed information about time-dependant signal behavior.

Print (Signals)

Debugger 34 sends a Print command to tell a resource interface circuit 18 to automatically forward all values of any selected emulation signals to debugger 34 indicating a current state of one or more emulation resource signals whenever any trigger signal (CTRIG, TTRIG or ETRIG) is asserted to halt emulation so that the debugger can display data indicating current states of those signals. An argument of the Print command identifies the signals that are subject to the Print command.

Display

Debugger 34 sends a Display command to a resource interface circuit 18 to tell it to automatically forward data to debugger 34 indicating the time varying behavior of one or more specified signals whenever any trigger signal is asserted to halt emulation so that the debugger can generate a waveform display based on the data. An argument of the Display command identifies the signals that are subject to the Display command.

Watch (Signal)

Debugger 34 can send a Watch command to resource interface circuits to tell them to assert the ETRIG signal whenever an emulation signal identified by an argument of the command changes state and to forward a packet to debugger containing data indicating the state of the signal. Debugger 34 can perform a logic operation on the data received from one or more resource interface circuits 18 regarding the state of one or more signals to determine whether a particular use-specified event has occurred and if so, will generate a display indicating the event has occurred. Having completed the logic operation, the debugger can send out a Continue command to tell resource interface 18 to de-assert the ETRIG signal, thereby allowing the clocking systems 16 to resume the emulation.

Dump_Value

Debugger 34 can send a Dump_value command to resource interface circuits 18 when the emulation is halted to tell them to forward packets to debugger 34 containing data indicating the current value of all monitored signals and data stored within all internal memory devices of their emulation resources 14 at the time emulation was halted. Debugger 34 stores that state data in the memory of computer 28.

Restore_Value (Data)

Debugger 34 can send a Restore_value command to tell a resource interface circuit 18 to write data to the internal memory devices within emulation resources 14, thereby setting emulation resources 14 to a desired state. The data to be written is included as an argument of the Restore_value command. Debugger 34 can use Restore-value commands, for example, to reset emulation resources 14 to a previous state indicated by data previously acquired using Dump value commands.

Get_Pio (Signals)

Debugger 34 can send a Get_pio command to SRLA 27 to tell it to send data indicating a current state of one or more of the primary input and output signals of emulation resources 14 monitored by SRLA 27 on each cycle of the PCLK signal. Since SRLA operates at the frequency of the PCLK signal, the Get_pio command allows debugger 34 to observe and display the current states of the primary input and output signals of emulation resources 14 during emulation. Arguments of the Get-pio command identify the signals of interest.

Force (Signals, States)

Debugger 34 can send a Force command to tell any resource interface circuit 18 to control one or more specified emulation signals of its local emulation resources 14 to specified states and to keep them at those states after emulation resumes. Arguments of the Force command identify the signals and indicates their forced states. Those signals can be input or generated signal of its local emulation resources 14.

Release (Signal)

Debugger 34 can send a Release command to any resource interface circuit 18 to undo any previously sent Force commands so that the resource interface circuit will stop forcing emulation signals to particular states. The argument of the Release command identifies the signals to be released.

Set_Pi (Signals, States)

Debugger 34 can send a Set-pi command to any a resource interface circuit 18 to tell it to set one or more specified primary input signals to the local emulation resources 14 to specified states when emulation resumes. Arguments of the command specify the signals and their states.

Add_Event (Event_Number, Code)

Debugger 34 can send an Add_event command to any one of SRLAs 27 to define a signal event that the SRLA is to watch for. An event-number argument labels the event and a code argument defines the event. An "event" can be either a state change in a single signal or some combination of states and stage changes in several signals. For example an event could be defined by the following line of code sent to in an Add_Event command to one of SRLAs 27:

Event_write_finished=((control_bus==0xa5) && (posedge clk))

This code means that an event called "Event_write_finished" occurs when signals on a set of lines 23 labeled "control_bus" have the value "0xa5" one the positive edge of a clock signal occurring on one of lines 23 labeled "clk".

Del_Event (Event_Number)

Debugger 34 can send a Del_event command to tell SRLA 27 to cancel a previously sent Add_event command Add_Trigger (Code)

Debugger 34 can send an Add_trigger command to SRLAs 27 to carry out specified activities upon detection of specified events in the signals conveyed on lines 23. The following is an example of code that could be included in an Add_trigger command Trigger 1=after "event_write_finished" occurs 10 times, move to trigger 2

Trigger 2=after "event_data_busy" successive for 10 ms, move to trigger 3

Trigger 3=halt emulation.

This code defines three triggers (1, 2 and 2). Trigger 1 tells the SRLA to take action after the SRLA has detected 10 occurrences of a previously defined event called "event_write_finished". The action SRLA is to take is to begin monitoring for the conditions defined by Trigger 2, which tells the SRLA to move to Trigger 3 after it has detected occurrence of an event called "event_data_busy" for 10 ms. Trigger 3 tells the SRLA to immediately send and ETRIG signal to clocking systems 16 telling them to halt emulation.

Del_Trigger (Trigger)

Debugger 34 can send a Del-trigger command tells an SRLA 27 to cancel a previously sent Add_trigger command. The argument of the command indicates the trigger to be deleted.

Set_Clock (Phase, Frequency)

Debugger 34 can send a Set-clock command to tell resource interface circuits 18 to set the phase and frequency of clocks CLK1-CLKN to values indicated by command arguments by altering the control data CONT supplied to clocking systems 16.

Set_Cycle_Count (M, CLKX)

Debugger 34 can send a Set-Cycle-Count command to tell resource interface circuits 18 to assert the CTRIG trigger signal after M cycles of one of the CLK_1-CLK_N signals. Arguments of the command indicate the value of M and identify the particular one of the CLK_1-CLKN signals (CLKX) to be the subject of the cycle count. This count is halted whenever emulation stops as a result of another trigger and resumes whenever emulation resumes. The count is reset only in response to a RUN command.

Set_Timer (M)

Debugger 34 can send a Set_Timer command to tell resource interface circuits 18 to assert the CTRIG trigger signal after M cycles of the primary clock signal PCLK once emulation starts or resumes. An argument of the command indicates the value of M. This count is halted whenever emulation stops as a result of another trigger and resumes whenever emulation resumes. The count is reset only in response to a RUN command.

Clock System

Figure 2:
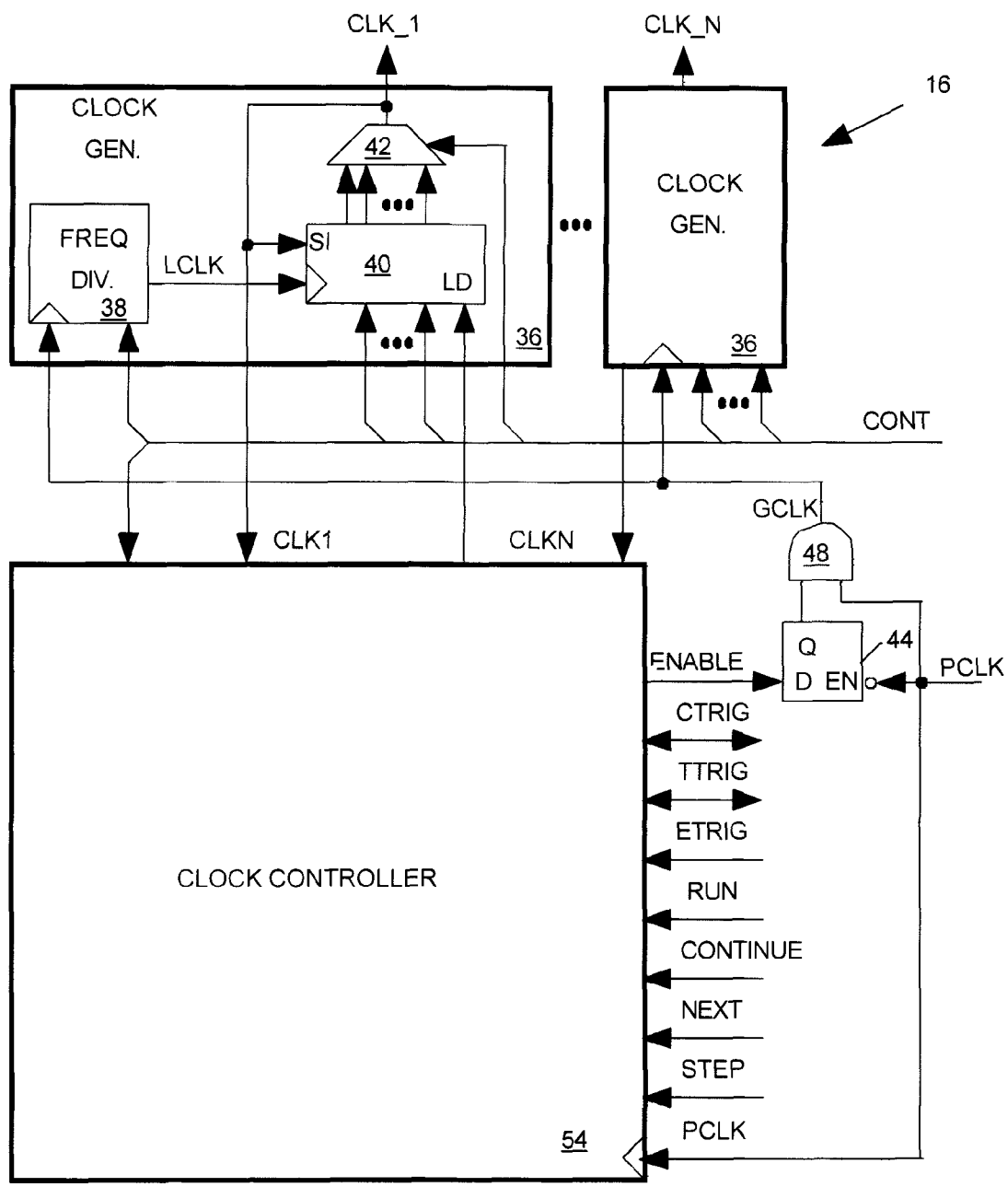
FIG. 2 illustrates the clocking system of FIG. 1 in more detailed block diagram form.

FIG. 2 illustrates an example implementation of the clock system 16 residing on each resource board 12 of FIG. 1. Each clocking system 16 processes the primary clock signal PCLK to produce the N clock signals CLK1-CLKN, each having an independently adjustable phase and frequency. Since each clock signal CLK1-CLKN is produced by a separate clock generator 36, the number N of available clock signals is limited only by the number of clock generators included in clocking system 16. Each clock generator 36 receives a clock signal GCLK that is a gated version of primary clock signal PCLK and produces its corresponding output clock signal CLK_1-CLK_N when GCLK is enabled. A frequency divider 38 (a counter) in each clock generator 36 frequency divides the GCLK signal to produce a local clock signal LCLK that clocks a serial/parallel-in, parallel-out shift register 40. Resource interface circuit 18 supplies control data (CONT) defined by a Set_clock commands to separately set the frequency ratio LCLK/GCLK for each clock generator 36. Resource interface circuit 18 also loads a separate parallel data word into the shift register 40 of each clock generator 36 in response to a Set_clock command. A multiplexer 42 controlled by the control data (CONT) from network interface circuit 18 selects one of the output bits of shift register 40 as the clock generator's output clock signal, and also feeds the CLK_1 signal back to the serial input (SI) of shift register 40. The parallel data word loaded into shift register 40 controls the duty cycle of the CLK1-CLKN signal and the CONT data supplied to multiplexer 42 sets its phase relative to LCKL. Thus Set-clock commands to network interface circuit 18 cause it to produce control data CONT that independently sets the phase, frequency and duty cycle of each clock signal CLK1-CLKN.

The PCLK signal and the Q output of a latch 44 drive inputs of an AND gate 48 producing the GLCK signal. An ENABLE signal from a clock controller 54 drives the D input of latch 44. The PCLK signal drives an inverted enable input of latch 44. AND gate 48 and latch 44 enable or disable the GLCK signal in response to edges of the PCLK signal depending on whether clock controller 54 has asserted or de-asserted the ENABLE signal Clock controller 54 suitably comprises a state machine clocked by the PCLK signal that receives the RUN, CONTINUE, NEXT, and STEP signals, that counts cycles of selected ones of the CLK1 and CLKN signals, that communicates with clock controllers of other resource boards via the CTRIG, TTRIG and ETRIG trigger signals, and that ENABLE signal supplied to latch 44. The control data (CONT) input from the local network interface circuit 46 of FIG. 1 identifies which clock signals (CLK1-CLKN and PCLK) are to be subjects of cycle counts and indicates the number M of cycles clock controller 54 is to count before asserting one of the trigger signals CTRIG or TTRIG. Clock controller 54 de-asserts the ENABLE signal to halt emulation whenever any of the CTRIG, ETRIG, or TTRIG trigger signals is asserted by itself or by a clock controller of another resource board, and re-asserts the ENABLE signal whenever all of those trigger signals are de-asserted.

The RUN signal is normally used to restart emulation after writing data to the memory devices in the emulator resources to set them to their initial states. The RUN signal tells clock controller 54 to signal register 40 of each clock generator 36 to load a parallel data word included in the CONT data from network interface circuit 46, thereby to reset phase relationships of all clock signals CLK1-CLKN to an initial state. Clock controller 54 then de-asserts any trigger signal it may be asserting and, when it detects all trigger signals are de-asserted, asserts the ENABLE signal on the next edge of the PCLK signal and continues to assert the ENABLE signal until it detects assertion of any of the trigger signals or until it has counted M cycles of a selected one of the CLK1-CLKN signals, where M is also included in the CONT data from network interface circuit 46. It then asserts the ENABLE signal and the CTRIG signal to halt the clocks. As discussed above, the value of M and the identify CLKx of the selected clock signal are controlled by arguments of commands (Run, Continue, Next, Step) from debugger 34 of FIG. 1.

Figure 3:
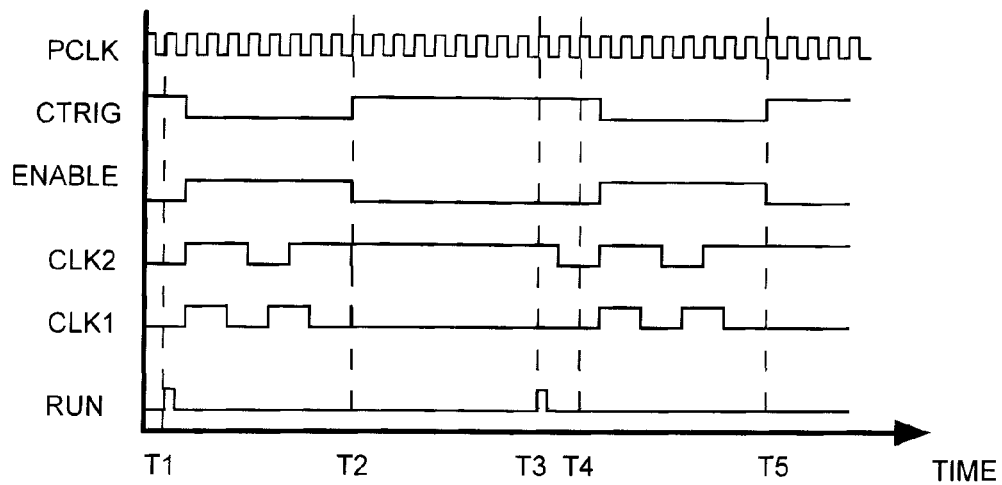
FIGS. 3 and 4 are timing diagrams illustrating behavior of signals of the clocking system of FIG. 2.

FIG. 3 illustrates timing relationships between various signals of FIG. 3 for two successive RUN signal assertions in response to Run commands, where M=2 and the clock signal edges to be accounted are those of CLK1. The first RUN signal is asserted at time T1 Clock controller 54 initializes the phase relationship between CLK1 and CLK2 by reloading control data into registers 40, de-asserts the CTRIG signal then and asserts the ENABLE signal, thereby enabling CLK1 and CLK2 on the next PCLK edge. At time T2, after the clock controller 54 has counted M =2 cycles of the CLK1 clock signal, it de-asserts the ENABLE signal and re-asserts the CTRIG signal to disable clocks CLK1 and CLK2. At time T3 the RUN signal is re-asserted. Clock controller 54 initializes the phase relationship between CLK1 and CLK2 so that when it de-asserts the CTRIG signal and asserts the ENABLE signal at time T4 CLK1 and CLK2 will be in phase with one another, just as they were at time T1.

Figure 4:
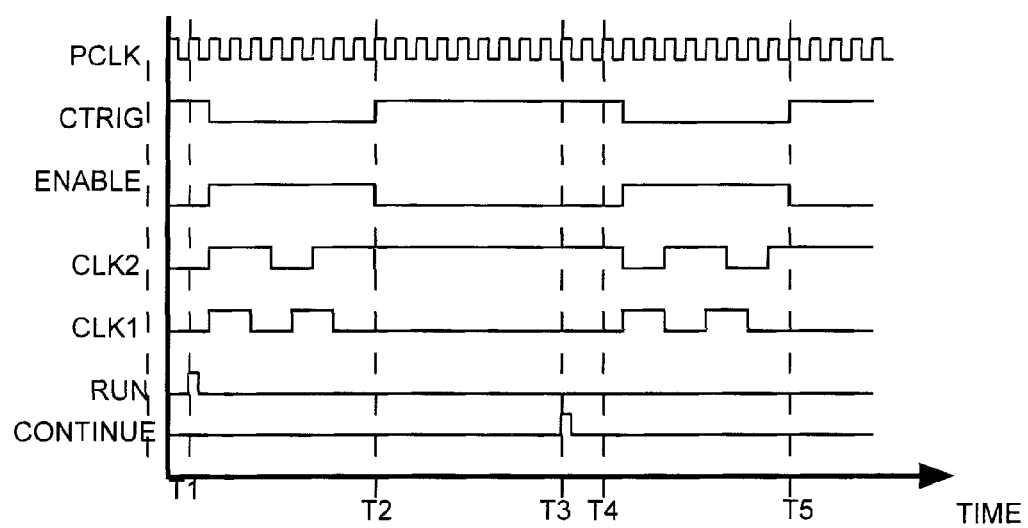

FIG. 4 illustrate timing relationships between the enable signal, the CTRIG signal and two clock signals CLK1 and CLK2 for a RUN signal assertion followed by a CONTINUE signal assertion in response to a Continue command, where M=2 and the clock signal edges to be counted belong to CLK1. The RUN signal is asserted at time T1 and the ENABLE signal is immediately asserted on the next PCLK edge because no trigger signals are asserted. At time T2, after the clock controller 54 has counted two cycles of the CLK1 clock, it de-asserts the enable signal and asserts the CTRIG signal. At time T3 the CONTINUE signal is asserted. Clock controller 54 does not reset the phase relationship between CLK1 and CLK2 so that when it de-asserts the CTRIG signal and asserts the ENABLE signal at time T4, CLK1 and CLK2 will continue the phase relationship that had at time T2 when the clocks were disabled.

While the above detailed description and the accompanying drawings describe both the organization and method of operation of what the applicant(s) consider to be the best mode of practicing the invention, the claims appended to this specification define the true scope and sprit of the invention. Although the best mode implements various aspects of the invention in particular ways described in detail herein, no claim is intended to limit any particular of aspect of the invention to its best mode implementation except to the extent that details of the best mode implementation are directly described in the claim itself.

The invention claimed is:

1. An apparatus for emulating a circuit, the apparatus comprising:
    emulation resources (14) programmed to emulate the circuit,
    a clocking system (16),
    a resource interface circuit (18),
    a logic analyzer (27), and
    a debugger in signal communication with the resource interface circuit and the logic analyzer,
        wherein the clocking system clocks the emulation resources,
        wherein the emulation resources emulate behavior of the circuit by generating internal signals and output signals in response to received input signals when clocked by the clocking system,
        wherein the resource interface circuit monitors ones of the signals received and generated by the emulation resources, and stores first data representing behavior of the signals it monitors, and
        wherein the logic analyzer monitors at least one of the emulation resource input, internal or output signals,
        wherein the logic analyzer signals the clocking system to stop clocking the emulation resources upon detecting an event in at least one of the emulation resource input, internal or output signals it monitors, and
        wherein the debugger receives and processes the first data stored by the resource interface circuit after the clocking system has stopped clocking the emulation resources.

2. The apparatus in accordance with claim 1 wherein the debugger transmits a command to the logic analyzer to define the event that is to cause the logic analyzer to signal the clocking system to stop clocking the emulation resources.

3. The apparatus in accordance with claim 1 wherein the clocking system generates a plurality of clock signals, and
    wherein the debugger transmits Set_Clock commands to the resource interface circuit telling it to configure the clocking system to set a frequency and phase of each clock signal.

4. The apparatus in accordance with claim 1 wherein the clocking system generates a plurality of clock signals, and
    wherein after the clocking system has stopped clocking the emulation resources, the debugger transmits a Continue command to the resource interface circuit telling it to configure the clocking system to continue clocking the emulation resources for a specified number of cycles of a selected one of clock signals.

5. The apparatus in accordance with claim 1 wherein the clocking system generates a plurality of clock signals, and
    wherein after the clocking system has stopped clocking the emulation resources, the debugger transmits a Next command to the resource interface circuit telling it to configure the clocking system to continue clocking the emulation resources for a specified number of cycles of a selected one of clock signals and to forward the first data representing behavior of the signals it monitors following each cycle of the selected one of the clock signals.

6. The apparatus in accordance with claim 1 wherein the clocking system generates a plurality of clock signals, and
    wherein after the clocking system has stopped clocking the emulation resources, the debugger transmits a Step command to the resource interface circuit telling it to configure the clocking system to continue clocking the emulation resources for a specified number of cycles of a selected one of clock signals and to forward the first data representing behavior of the signals it monitors following each edge of each one of the plurality of clock signals.

7. The apparatus in accordance with claim 1 wherein the debugger transmits a Print command to the resource interface circuit telling it to forward first data representing time-varying behavior of at least one of the emulation resource input, internal or output signals it monitors to the debugger whenever the clocking system stops clocking the emulation resources.

8. The apparatus in accordance with claim 1 wherein the debugger transmits a Display command to the resource interface circuit telling it forward first data representing time-varying behavior of at least one of the emulation resource input, internal or output signals time whenever the clocking system stops clocking the emulation resources.

9. The apparatus in accordance with claim 1 wherein the debugger transmits a Watch command to the resource interface circuit telling it to signal the clocking system to stop clocking the emulation resources whenever one of the emulation resource input, internal or output signals specified by an argument of the Watch command changes state.

10. The apparatus in accordance with claim 1
wherein the emulation resources include memory devices for storing second data representing a state of the portion of the circuit being emulated and
wherein the debugger transmits a Dump-value command to the resource interface circuit of each resource board telling it to read the second data and send it to the debugger.

11. The apparatus in accordance with claim 1
wherein the emulation resources comprise memory devices for storing second data representing a current state of the circuit being emulated, and wherein the debugger transmits a Restore_value command to the resource interface circuit telling it write the second data to the memory devices of the emulation resources.

12. The apparatus in accordance with claim 1
wherein the debugger transmits a Force command to the resource interface circuit telling it to control a specified one of the emulation resource input, internal or output signals until the debugger transmits a Release command to the resource interface circuit telling it stop controlling the specified one of the emulation resource input, internal or output signals.

13. An apparatus for emulating a circuit, the apparatus comprising:
a logic analyzer;
a clock source (37) for generating a primary clock signal;
a plurality of conductors(38) for conveying trigger signals;
a plurality of resource boards (12), each comprising
emulation resources (14) programmed to emulate a portion of the circuit when clocked by at least one clock signal by receiving input signals and by generating internal signals and output signals,
a clocking system (16) for transmitting and receiving said trigger signals via the plurality of conductors, for generating a plurality of clock signals in response to the primary clock signal when all of the trigger signals are de-asserted and for refraining from generating the plurality of clock signals when any one of the trigger signals is asserted, wherein the plurality of clock signals include the at least one clock signal for clocking the emulation resources, and wherein each of the plurality of clock signals is of adjustable phase and frequency, and
a resource interface circuit (18) for monitoring selected ones of the input, internal and output signals of the emulation resources, and for storing first data representing behavior of the selected ones of the emulation resource input, internal and output signals it monitors, and
a debugger in signal communication with the logic analyzer and the resource interface circuits,
and wherein the logic analyzer monitors at least one of the emulation resource input, internal and output signals of the emulation resources and asserts at least one of the trigger signals upon detecting an event in the at least one of the emulation resource input, internal and output signals of the emulation resources, thereby causing the clocking system on each of the plurality of resource boards to stop clocking the emulation resources, and wherein the debugger receives and processes the first data stored by the resource interface circuits after the clocking systems have stopped clocking the emulation resources.

14. The apparatus in accordance with claim 13 further comprising:
a packet routing network, and
wherein the debugger is implemented by a computer linked to the resource interface circuit of each resource board by the packet routing network, for communicating with the resource interface circuit in each resource board via packets transmitted over the packet routing network,
and wherein the resource interface circuit of each resource board monitors the trigger signals conveyed by the plurality of conductors and sends the first data it stores to the debugger via the packets conveyed over the packet routing network when any trigger signal is asserted.

15. The apparatus in accordance with claim 14 wherein the packet routing network also links the computer to the logic analyzer, and wherein the debugger transmits a packet via the packet routing network to the logic analyzer, the packet containing a command defining the event that is to cause the logic analyzer signal to assert said at least one of the trigger signals.

16. The apparatus in accordance with claim 15 wherein the debugger transmits any one of the following commands in a packet to the resource interface circuit via the packet routing network:
a Continue command telling the resource interface circuit to signal the clocking system to de-assert any trigger signal it may be asserting and to continue clocking the emulation resources for a specified number of cycles of a selected one of clock signals when all of the trigger signals are de-asserted,
a Next command telling the resource interface circuit to signal the clocking system to de-assert any trigger signal it may be asserting and to continue clocking the emulation resources for a specified number of cycles of a selected one of clock signals after all trigger signals are de-asserted, and to forward first data representing behavior of the signals it monitors following each cycle of the selected one of the clock signals,
a Step command telling the resource interface circuit to signal the clocking system to de-assert any trigger signal it may be asserting and to continue clocking the emulation resources for a specified number of cycles of a selected one of clock signals after all trigger signals are de-asserted, and to forward first data representing behavior of the emulation resource input, internal or output signals it monitors following each cycle of any one of the clock signals.

17. The apparatus in accordance with claim 15 wherein the debugger transmits a Watch command telling the resource interface to assert one of the trigger signals whenever one of the emulation resource signals selected by the command changes state.

18. The apparatus in accordance with claim 15
wherein the emulation resources of each resource board includes memory devices for storing second data controlling a state of the portion of the circuit being emulated,
wherein the debugger transmits a Dump-value commands via packets conveyed over the packet routing network to the resource interface circuit of each resource board telling it to read the second data and send it to the debugger, and
wherein the debugger transmits a Restore_value command and second data via packets conveyed over the packet routing network to the resource interface circuit of each resource board telling it write the second data to the memory devices of the emulation resources to alter the state of the circuit being emulated.

19. The apparatus in accordance with claim 15 wherein the debugger transmits a Force command to the resource interface circuit of each resource board via a packet conveyed over the packet routing network telling it to control a specified signal of the emulation resources to a specified state and to hold it at that state until the debugger transmits a Release command to the resource interface circuit telling it stop forcing the specified signal to the specified state.

* * * * *